United States Patent [19]

Jacobs

[11] Patent Number: 5,444,288

[45] Date of Patent: Aug. 22, 1995

[54] CMOS INTEGRATED CIRCUIT HAVING IMPROVED POWER-SUPPLY FILTERING

[75] Inventor: Eino Jacobs, Palo Alto, Calif.

[73] Assignee: U.S. Philips Corporation, New York, N.Y.

[21] Appl. No.: 270,091

[22] Filed: Jul. 1, 1994

Related U.S. Application Data

[63] Continuation of Ser. No. 26,137, Feb. 25, 1993, abandoned.

[30] Foreign Application Priority Data

Feb. 27, 1992 [EP] European Pat. Off. ........... 92200565

[51] Int. Cl.⁶ .................. H01L 27/04; H01L 23/48; H01L 29/46
[52] U.S. Cl. .................................. 257/503; 257/343; 257/369; 257/386; 257/546
[58] Field of Search ............... 257/275, 277, 368, 369, 257/386, 503, 546, 630, 927, 213, 265, 379, 499

[56] References Cited

U.S. PATENT DOCUMENTS

| | | | |
|---|---|---|---|
| 4,314,268 | 2/1982 | Yoshioka et al. | 257/503 |
| 4,419,684 | 12/1983 | Sakai et al. | 257/503 |
| 4,707,718 | 11/1987 | Sakai et al. | 257/927 |
| 4,833,521 | 5/1989 | Early | 257/503 |

FOREIGN PATENT DOCUMENTS

| | | | |
|---|---|---|---|
| 1204511 | 5/1986 | Canada . | |
| 60-233838 | 1/1985 | Japan . | |
| 02210849 | 8/1990 | Japan | 257/386 |

Primary Examiner—Mahshid D. Saadat
Attorney, Agent, or Firm—Steven R. Biren

[57] ABSTRACT

An important problem in large integrated circuits is constituted by noise superimposed on the supply. This noise is particularly caused by switching of switching elements such as flipflops, and by heavily loaded output stages. These elements cause current peaks which may give rise to comparatively great fluctuations in voltage. This problem is solved at least to a great extent in CMOS circuits with standard cells or with custom layout blocks by means of an additional decoupling capacitance in the form of an extra well in the routing channels. The decoupling capacitance may be positioned immediately adjacent the switching element, which is favorable for suppressing the supply noise. Since the routing channels are generally not used for providing circuit elements, the chip surface area is not or substantially not increased by this extra capacitance.

5 Claims, 2 Drawing Sheets

CMOS INTEGRATED CIRCUIT HAVING IMPROVED POWER-SUPPLY FILTERING

This is a continuation of application Ser. No. 08/026,137, filed Feb. 25, 1993.

BACKGROUND OF THE INVENTION

The invention relates to a CMOS integrated circuit comprising a semiconductor body with a layer-shaped region of substantially a first conductivity type adjoining a surface, in which region an electric circuit is provided having at least two adjacent circuit blocks separated from one another by an intermediate region and formed in particular but not exclusively by rows of standard cells, which circuit blocks are built up from MOS transistors having a channel of the second conductivity type and provided in the layer-shaped region of the first conductivity type and from MOS transistors having a channel of the first conductivity type and provided in surface regions of the second conductivity type, called first surface regions hereinafter, while the surface is covered with an electrically insulating layer on which a wiring pattern is provided comprising a supply line and one or several signal lines provided above the intermediate region.

An integrated circuit realised with standard cells is described inter alia in the book "Geïntegreerde MOS-schakelingen, een inleiding tot VLSI en ASIC's" (Integrated MOS Circuits, an Introduction to VLSI and ASICs) by H. Veendrick, (1990) Delta Press BV, Amerongen, the Netherlands, in particular pp. 376–77. The standard cells may have various kinds of logic gates which may all have the same height. The cells are arranged in rows which are mutually separated by transistorless interspacings which are used as wiring channels. In the wiring channels, conductor tracks are formed which interconnect the cells so as to guide signals from one cell to another cell. The width of the wiring channels may vary in dependence on the quantity of wiring. The supply lines are usually laid immediately above the cells, but sometimes they are provided in the wiring channels.

Noise superimposed on the supply may form a major problem in large integrated circuits. This noise may be caused, for example, by switching of certain elements, for example flipflops, in particular when more elements switch simultaneously, whereby locally considerable currents and thus high voltage peaks occur in the supply lines. Another source of noise may be formed by heavily loaded output stages. The peak currents in the supply may cause voltage changes in the circuit which adversely affect parameters such as, for example, speed and reliability. Canadian Patent 1,204,511 proposes to reduce supply noise by means of decoupling capacitances which are formed by a local capacitor consisting of a reverse-biased pn junction which is connected to the supply. This capacitor requires additional space so that the crystal becomes larger and the circuit accordingly becomes more expensive. In addition, it is often desirable to lay the decoupling capacitor even closer to the elements causing the said current peaks than in this known circuit.

It will be clear that the problems described above will not occur in standard cells only. The present invention offers a solution to these problems in circuits which are built up in blocks, which blocks comprising circuit portions are provided in a more or less regular pattern on the chip, mutually separated by routing channels.

SUMMARY OF THE INVENTION

The invention has for its object to provide a device of the kind mentioned in the opening paragraph in which a maximum decoupling capacitance is obtained without requiring additional space. Another object of the invention is to position the decoupling capacitance as close to the elements as possible, so that the current peaks are practically purely local and have no or substantially no crosstalk to other portions of the circuit.

According to the invention, a CMOS integrated circuit of the kind described in the opening paragraph is characterized in that the layer-shaped region of the first conductivity type is provided with one or several additional surface regions of the second conductivity type at the area of the intermediate region below the signal lines, which regions are electrically connected to the supply line. Since the space in the semiconductor body below the wiring channels is generally not used for circuit elements, the provision of the additional decoupling capacitance below the wiring channels requires no extra space which would lead to an increase in the surface area. Thanks to the invention, in addition, the decoupling capacitance can be positioned at a very small distance from the switching elements.

A special embodiment, which has the advantage that the additional surface regions can be provided simultaneously with the said first surface regions, is characterized in that the additional surface regions have a same thickness and doping concentration as the first surface regions in which the MOS transistors with channels of the first conductivity type are provided. A further embodiment of a device according to the invention, in which no separate contacts are necessary for the additional surface regions, is characterized in that at least one of the additional surface regions together with at least one of the first surface regions forms a continuous surface zone of the second conductivity type. A further embodiment, in which a further increase of the decoupling capacitance is obtained without an increase in the surface area of the semiconductor body, is characterized in that the supply line is connected to a contact pad through a conductor track which is situated next to the circuit blocks, the layer-shaped region of the first conductivity type being provided with a surface region of the second conductivity type below this conductor track, which surface region is connected to the conductor track.

BRIEF DESCRIPTION OF THE DRAWING

The invention will be explained in more detail with reference to several embodiments and the accompanying diagrammatic drawing, in which.

Figure 1:
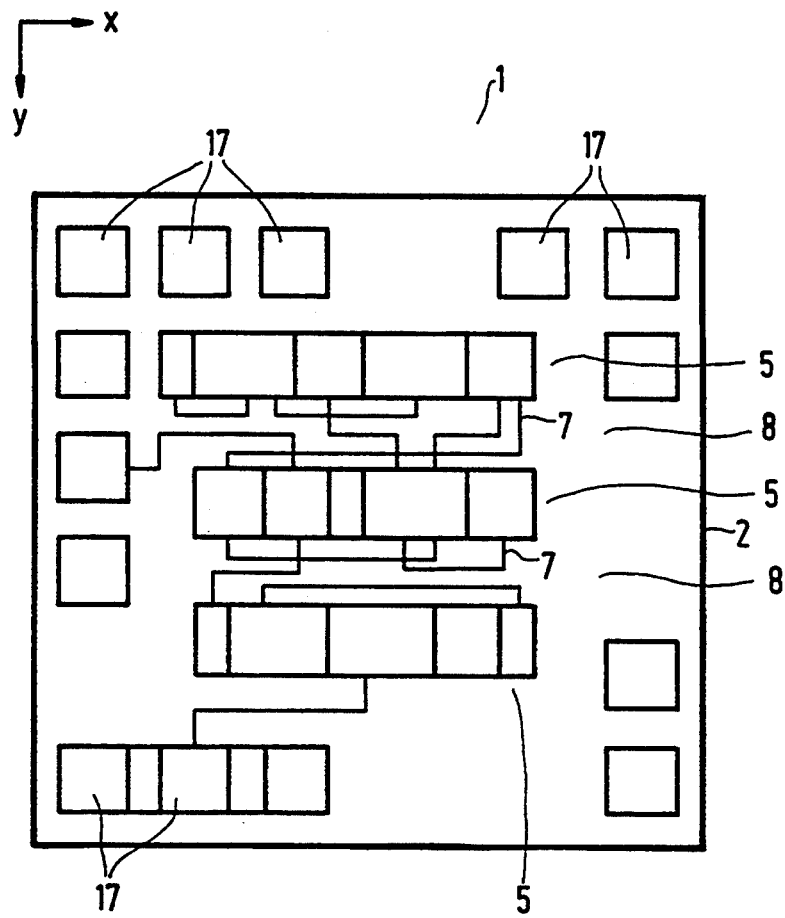
FIG. 1 is a diagrammatic plan view of an integrated circuit with standard cells according to the invention.

It is noted that the drawing is only diagrammatic and that the various components of the circuit are not depicted true to scale.

DESCRIPTION OF THE PREFERRED EMBODIMENTS

Figure 3:
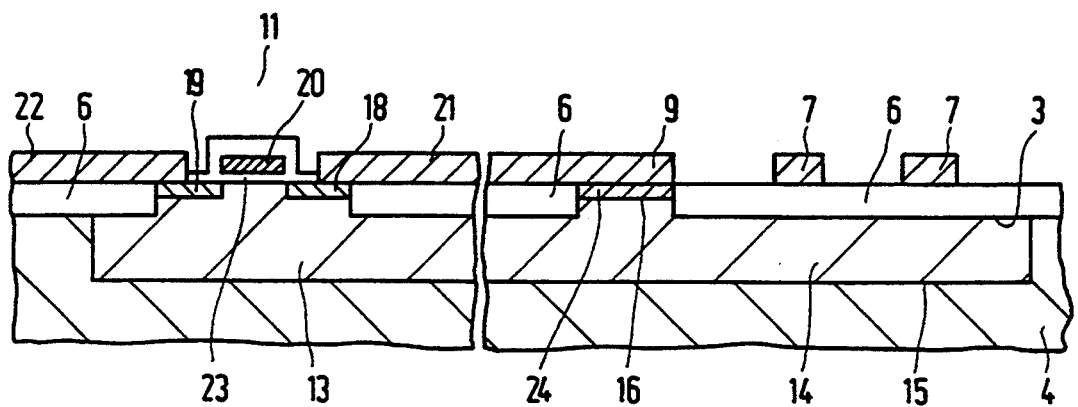
FIG. 3 is a cross-section of a portion of the device of FIG. 2.
Figure 2:
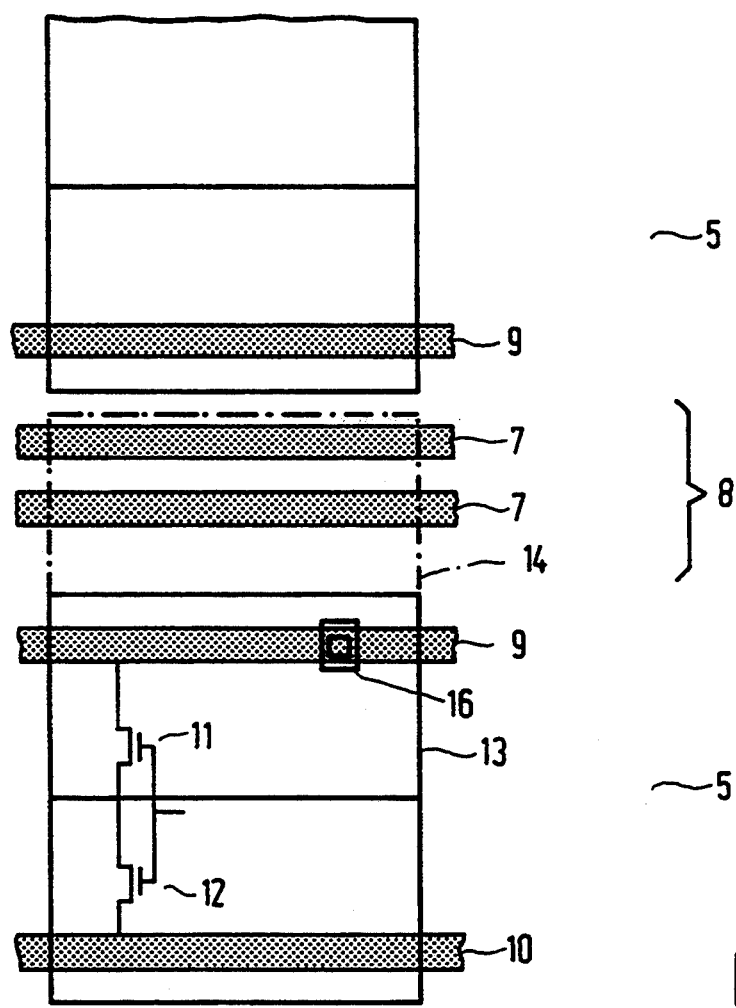
FIG. 2 shows a portion of FIG. 1 on an enlarged scale.

The device of FIGS. 1-3 shows a CMOS integrated circuit 1 with a semiconductor body 2 of, for example, silicon or a different suitable semiconductor material. The semiconductor body comprises a layer-shaped region 4 of substantially a first conductivity type, in the present example the p-type, adjoining the surface 3. The circuit provided in the layer-shaped region 4 is built up from standard cells. Such standard cells may comprise various gates, for example, logic gates such as inverter circuits, AND gates, OR gates, etc., or gates such as flipflops, which are usually available to the designer in a so-called library during the design of an integrated circuit. The cells in the present example have the same height (dimension in the y-direction); the lengths of the cells (dimension in the x-direction) depend on, for example, the number of components in the cell and may be mutually different. The cells are arranged one after the other to form rows 5 which extend in the x-direction; the rows, which may be of different lengths, are laid next to one another in the y-direction. FIG. 1 shows only three rows 5, but in actual fact the number of rows will usually be much greater. Above the surface, and separated from this surface by an insulating layer 6 of, for example, silicon oxide, a wiring pattern 7 in the form of conductor tracks is provided. Apart from supply lines, which will be discussed further below, the wiring pattern comprises signal lines for passing on electrical signals to the standard cells and from one standard cell to another, possibly in the same row, possibly in another row 5. The signal lines 7 are provided in intermediate regions 8 between the rows 5 which serve only to accommodate the wiring and which are empty for the rest, i.e. contain no circuit elements such as transistors. The intermediate regions 8 will also be called wiring channels or routing channels in the following description. The supply lines 9 and 10 depicted in FIG. 2, to which the positive voltage $V_d$ or the reference voltage $V_s$ can be applied during operation, may also be provided in the routing channels 8, but in the present example they are laid immediately above the standard cells in the rows 5.

The standard cells comprise complementary MOS transistors of which the p-channel MOST 11 and the n-channel MOST 12 are drawn in FIG. 2. The transistors 11 and 12 form, for example, an inverter in which an input signal is supplied to the interconnected gate electrodes and the output signal is derived from the interconnected drains; the sources of the transistors 11 and 12 are connected to the positive supply line 9 and the negative supply line 10, respectively. Obviously, further circuit elements may be present in the cell drawn in FIG. 2. The transistor 11, with p-type source and drain, is provided in a surface region 13 of the conductivity type opposite to that of the substrate 4, so of the n-type. Surface regions 13 are usually designated as "wells" or as "pockets" in the literature. The n-channel MOST 12 with n-type source and drain zones may be formed directly in the p-type substrate 4 in known manner.

At the area of the intermediate regions 8 between the rows 5 of standard cells and below the wiring 7, according to the invention (FIG. 2), the layer-shaped region or substrate 4 of the p-type is provided with one or several additional surface regions 14 of the n-type which are electrically connected to the supply line 9. This additional region 14 is indicated with a dot-dash line in FIG. 2. Owing to this region, a large additional capacitance formed by the pn-junction 15 between the substrate 4 and the n-type region 14 which is connected in parallel to the supply line 9, acting as a buffer in the case of large local current peaks, so that voltage fluctuations in the line 9 are reduced. The surface region 14 may be formed at any n-type doping step in the process. For reasons of process technology, however, it is most convenient to provide the zone 14 simultaneously with the well 13, so that the region 14 has the same thickness and doping concentration as the well 13. The region 14 and the well 13 form a continuous n-type zone, so that the connection between the supply line 9 and the zone 14 is obtained through the well 13 which, in usual manner, is connected to the line 9 at the area of the contact 16.

FIG. 1 shows, besides the rows 5 and the routing channels 8, a number of contact pads 17 along the circumference of the integrated circuit for the fastening of wires. The cross-section according to FIG. 3 shows from left to right a p-channel MOST 11, with a p-type source and drain 18 and 19, respectively, formed in the n-type region 13 and with a gate electrode 20. The source 18 is connected to the supply line 9 through a conductor 21, and to the n-type well 13 through the supply, while the drain 19 is connected to the conductor 22 through which the drain 19 can be connected to the n-type drain, not shown in FIG. 3, of the transistor 12. The gate electrode 20 is separated from the transistor channel by the thin gate oxide 23. To the right of the transistor, FIG. 3 shows the connection 16 between the supply 9 and the n-type well 13, with the n-type contact zone 24 in the opening 16 in the field oxide 6. The n-type well 13 then merges into the additional n-type region 14 which provides the extra decoupling capacitance for the supply, as described above. The region 14 is covered with a thick oxide layer 6 on or above which the conductor tracks 7 of the wiring channels are provided.

The device may be manufactured in a manner which is generally known per se, familiar to those skilled in the art, and which is not explained in any detail here. In a specific embodiment, the height of the standard cells was approximately 70 $\mu$m, while the height of the n-well 13 was approximately 35 $\mu$m. The width of the routing channels, i.e. the interspacing between the rows 15 in this embodiment, was also approximately 70 $\mu$m. By filling this interspacing with the additional region 14, it is possible to make the decoupling capacitance about three times that of a standard well. A standard cell with an inverter whose length (dimension in the x-direction) in this specific embodiment was approximately 12.8 $\mu$m, yielded an additional decoupling capacitance of approximately 140 fF in the manner described above. A flipflop cell with a length of approximately 76.8 $\mu$m yields an extra decoupling capacitance of approximately 845 fF. These large capacitances are obtained without an increase in the surface area of the semiconductor body and without changes in the process. A very important aspect of the invention is that the decoupling capacitances are situated immediately adjacent the current-conducting circuit elements, so that the current peaks arising through switching of the elements are substantially only local and have no or hardly any crosstalk to other portions of the integrated circuit.

Figure 4:
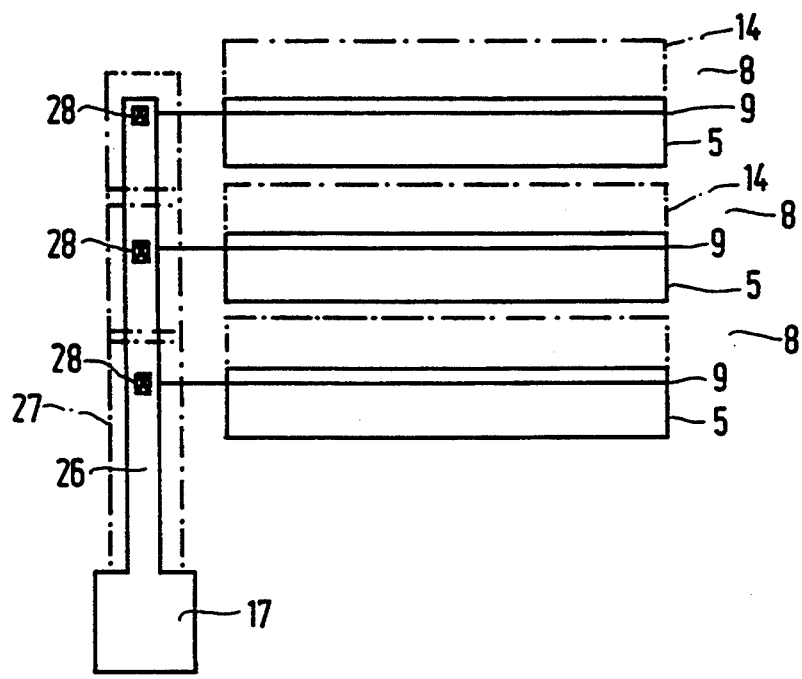
FIG. 4 is a plan view of portion of an integrated circuit according to a second embodiment of the invention.

FIG. 4 is a diagrammatic plan view of a portion of a second embodiment of an integrated circuit according to the invention. Corresponding components in FIG. 4 have the same reference numerals as in the first embodiment. The circuit again comprises a number of rows 5 of standard cells, of which three are shown in the drawing. The rows 5 are mutually separated by routing channels 8, the wiring being left out again for reasons of clarity. Decoupling capacitances in the form of wells 14 are provided below each of the routing channels, in the same manner as in the preceding embodiment.

These capacitances are shown as a continuous zone in the drawing, but it will be apparent that this is not necessarily the case and that a separate well 14 may be formed for each standard cell. The supply lines 9 are connected to a contact pad 17 through a comparatively wide conductor track 26 which extends substantially transversely to the longitudinal direction of the rows 5 over the surface of the device. The track 26 may be formed in the same wiring layer as the conductor tracks 9, but is often provided in a different metal layer. To obtain a further increase in the decoupling capacitance of the supply lines, an n-type surface region 27, indicated with a dot-dash line in the drawing, is provided below the conductor track 26 in the p-type substrate. The conductor track 26 is connected to the region 27 at the area of contacts 28. The zone 27 may form a single continuous region, but it may alternatively be subdivided, as shown in the drawing, into a number of partial regions each connected to the conductor track 26. The region 27 may be manufactured simultaneously with the regions 14 and with the n-type well of the cells. An important further increase in the decoupling capacitance is obtained in this manner without an enlargement of the circuit, because the space below the track 26 is not used anyway for providing switching elements.

It will be apparent that the invention is not limited to the embodiments described here, but that many variations are possible to those skilled in the art within the scope of the invention. Thus the conductivity types in the examples described may be interchanged, so that the substrate 4 is of the n-type and the well 13 and the additional region are of the p-type. The polarity of the voltage between the substrate and the regions 13-14 should then also be inverted, of course. Apart from MOS transistors, different circuit elements, such as bipolar transistors, resistors, capacitors, diodes, etc., may be included in the circuit. The invention is applicable in circuits for both digital and analog and mixed analog/digital functions. The invention is not limited to circuits comprising standard cells, but may also be used in circuits with custom layout blocks and routing channels between the blocks.

I claim:

1. A CMOS integrated circuit comprising a semiconductor body with a layer-shaped region of a first conductivity type adjoining a surface, in which region an electrical circuit is provided having at least two adjacent circuit blocks separated from one another by an intermediate region and formed by rows of standard cells, which circuit blocks are built up from MOS transistors having a channel of the second conductivity type and provided in the layer-shaped region of the first conductivity type and from MOS transistors having a channel of the first conductivity type and provided in first surface regions of the second conductivity type, the surface being covered with an electrically insulating layer on which a wiring pattern is provided comprising a supply line and at least one signal line provided above the intermediate region, and means for increasing a capacitance of said supply line without increasing an area of the integrated circuit, said means comprising the layer-shaped region of the first conductivity type being provided with at least one additional surface region of the second conductivity type at the area of the intermediate region below the at least one signal line, which at least one additional surface region is electrically connected to the supply line.

2. A CMOS integrated circuit as claimed in claim 1, characterized in that the at least one additional surface regions has a same thickness and doping concentration as the first surface regions in which the MOS transistors with channels of the first conductivity type are provided.

3. A CMOS integrated circuit as claimed in claim 1, characterized in that the at least one additional surface region together with the at least one first surface region forms a continuous surface zone of the second conductivity type.

4. A CMOS integrated circuit as claimed in claim 1, characterized in that the layer-shaped region is of the p-conductivity type and the first and the at least one additional surface region are of the n-conductivity type.

5. A CMOS integrated circuit as claimed in claim 1, characterized in that the supply line is connected to a contact pad through a conductor track which is situated next to the circuit blocks, the layer-shaped region of the first conductivity type being provided with a surface region of the second conductivity type below this conductor track, which surface region is connected to the conductor track.

* * * * *